United States Patent [19]
Koga

[11] Patent Number: 4,694,455
[45] Date of Patent: Sep. 15, 1987

[54] DECODING METHOD FOR MULTIPLE BIT ERROR CORRECTION BCH CODES

[75] Inventor: Keiichiro Koga, Saitama, Japan

[73] Assignee: Kokusai Denshin Denwa Co., Ltd., Tokyo, Japan

[21] Appl. No.: 772,504

[22] Filed: Sep. 4, 1985

[30] Foreign Application Priority Data

Sep. 4, 1984 [JP] Japan .................. 59-183755

[51] Int. Cl.⁴ .............................. G06F 11/12
[52] U.S. Cl. .......................... 371/37; 371/38
[58] Field of Search ........... 371/37, 38, 39, 40

[56] References Cited

U.S. PATENT DOCUMENTS

| | | | |
|---|---|---|---|
| 3,983,536 | 9/1976 | Telfer | 371/37 |
| 4,013,997 | 3/1977 | Treadwell | 371/38 |
| 4,360,916 | 11/1982 | Kustedjo | 371/37 |
| 4,468,769 | 8/1984 | Koga | 371/37 |
| 4,473,902 | 9/1984 | Chen | 371/37 |
| 4,498,175 | 2/1985 | Nagumo | 371/37 |
| 4,502,141 | 2/1985 | Kuki | 371/37 |
| 4,509,172 | 4/1985 | Chen | 371/38 |
| 4,519,079 | 5/1985 | Homer | 371/38 |
| 4,556,977 | 12/1985 | Olderdissen | 371/37 |
| 4,564,944 | 1/1986 | Arnold | 371/37 |
| 4,608,692 | 8/1986 | Nagumo | 371/38 |

Primary Examiner—Michael R. Fleming
Attorney, Agent, or Firm—Armstrong, Nikaido, Marmelstein & Kubovcik

[57] ABSTRACT

In an error correction code decoding system using BCH (Bose-Chaudhuri-Hocquenghem) code for correcting error bits in input data $Y=(y_1, y_2, ---, y_n)$ having the steps of obtaining syndrome $S=(S_1, S_2, --, S_n)$ through calculation of $YH'$, where $H$ is a parity check matrix, obtaining determinant $Q_t$ (equation 6) which has elements of said syndrome $S=(S_1, S_2, ---, S_n)$, and Q determinant which is provided by deleting some rows and columns including specified diagonal elements of said $Q_t$ determinant, determining coefficients of error locator polynominal by using said Q determinant, and solving said error locator polynomial, the improvement that said Q determinant is calculated by Q determinant storage means for storing the calculated Q determinant, and calculation means for providing accumulation of product (equation 11) of Q determinant in said storage means and square of said syndrome, and updating said storage means in order to simplify decoding equipment. Said $Q_t$ determinant and Q determinant may be replaced by Q polynomial, and the square of the syndrome by the syndrome itself.

5 Claims, 10 Drawing Figures

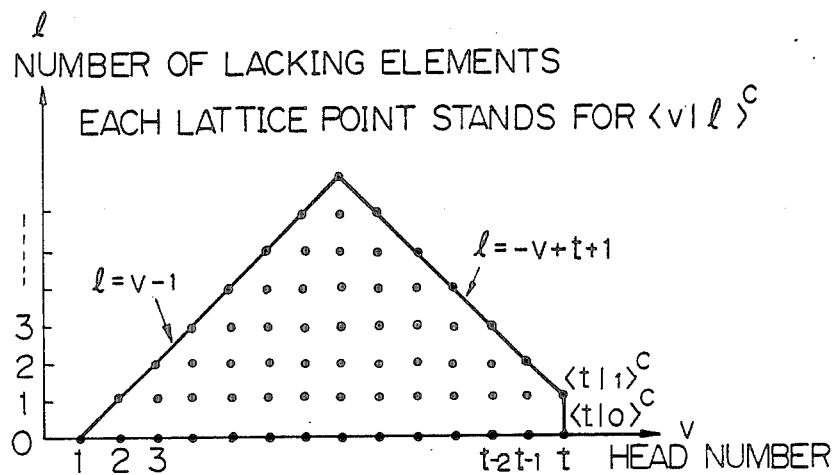
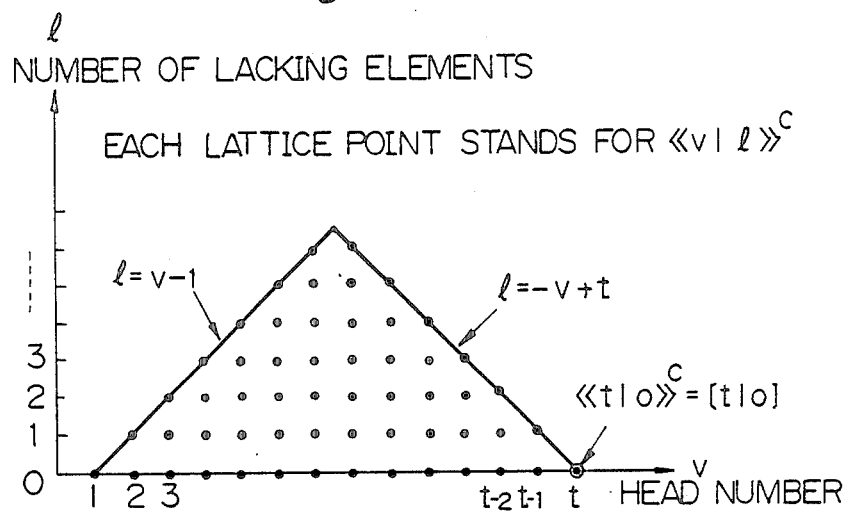

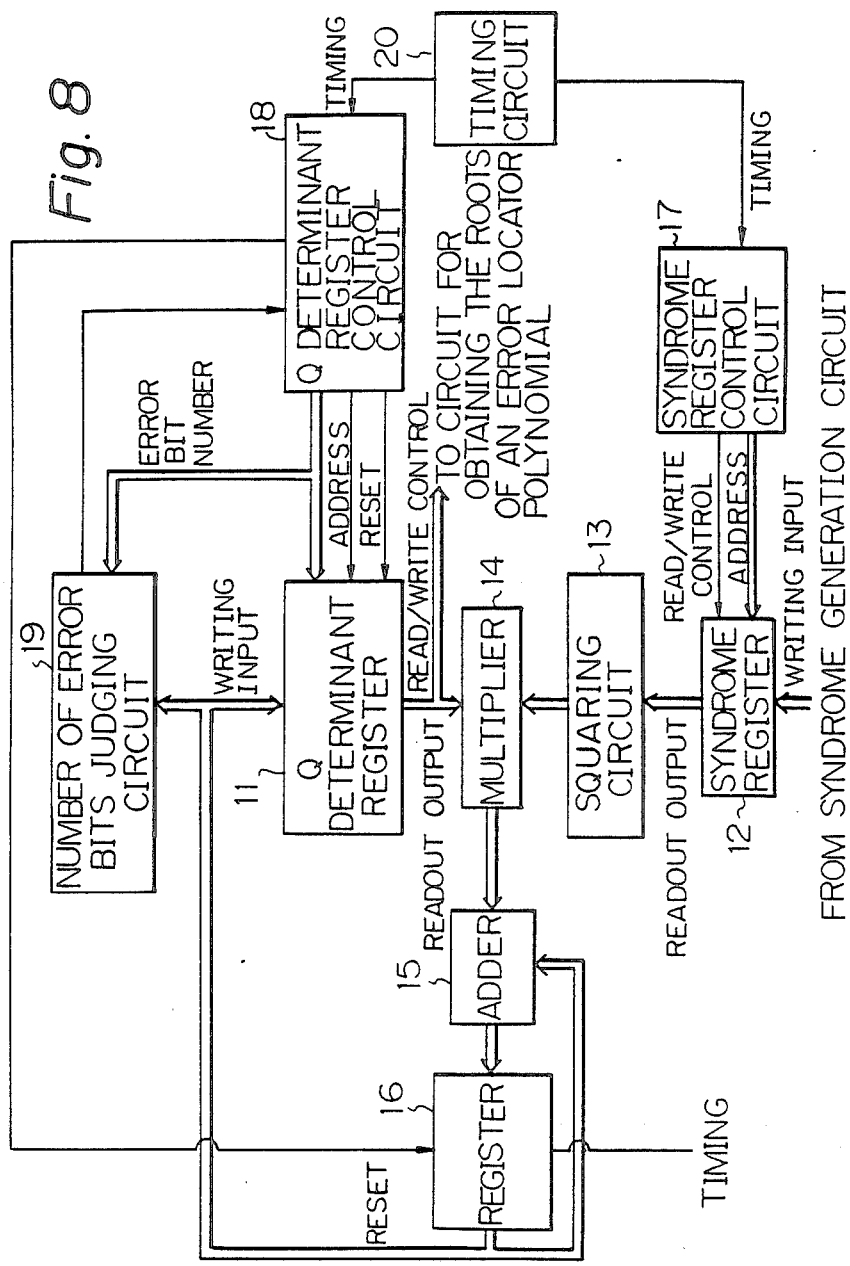

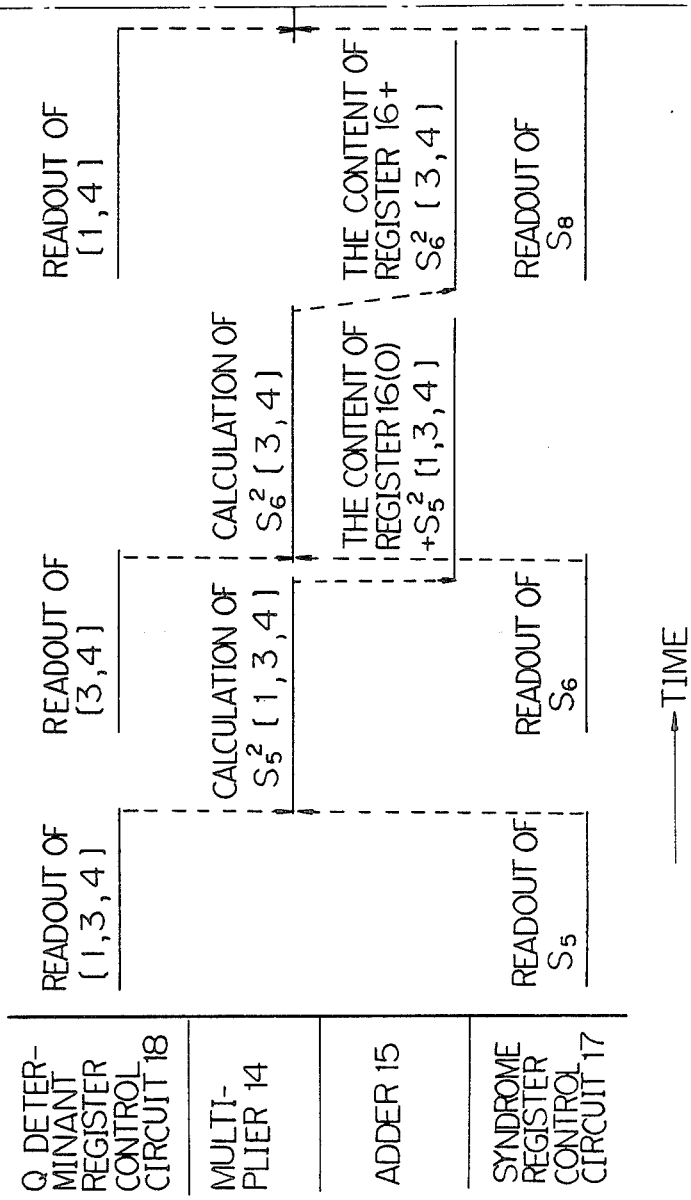

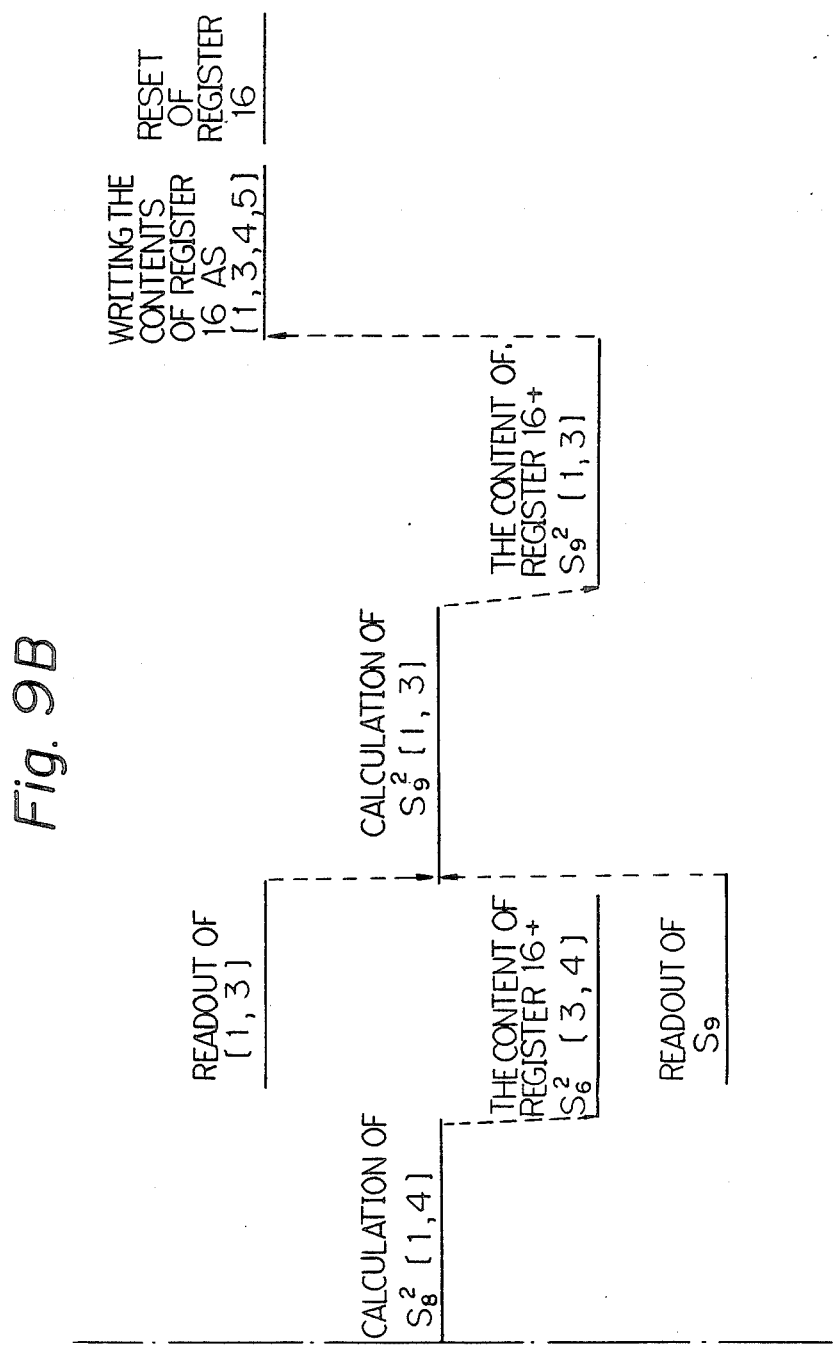

DECODING METHOD FOR MULTIPLE BIT ERROR CORRECTION BCH CODES

BACKGROUND OF THE INVENTION

The invention is concerned with an error correcting code decoding system for use in digital communication networks using error correcting codes where transmission errors are corrected automatically at the receiving station.

Of various kinds of error correcting code proposed so far, Bose-Chaudhuri-Hocquenghem code (in short BCH code) has been widely used in practice for its high degree of freedom for choosing code length and number of correctable errors, and its error correcting capability achieved with relatively few check bits.

A decoding process of the BCH code word is shown, for example, in Chapter 7.3 of "Coding theory" (by Miyagawa, Iwadare, and Imai; Shokodo Publishing Co.) where a received code word (it may have a bit error or bit errors) is first input to a feedback shift register whose structure corresponds to the code generator polynomial in order to obtain the syndromes. The syndromes thus obtained make it possible to derive an error locator polynomial by means of Peterson's method or Barenkampf-Massey's methods. The roots of the error locator polynomial indicate the error bit positions, if any, of the received code word, and the correction can be performed accordingly.

Several methods for deriving an error locator polynomial from given syndromes, other than one described above, have been known.

One of them is described in the following paper. (Koga: "A new decoding method of binary BCH code.", Trans. of the Institute of Electronics and Communication Engineers of Japan, Vol J 66-A, No. 10, pp. 925/932, October 1983)

This method shows that the coeffieicnts of the error locator polynomial of a received code word are calculated with symmetrical determinants whose elements are chosen from among the syndromes. And a useful method for calculating these determinants is proposed in the following paper. (Koga, Yamasaki: "A simple method of calculating the coefficients of error location polynomial in binary BCH code.", 1984 National Convention of the Institute of Electronics and Communication Engineers of Japan, 1456, March 1984)

This method shows that a determinant of order k of the kind is calculated by adding a certain number of products of determinant of order less than k and the square of syndrome.

The conventional methods for obtaining the error locator polynomial have a drawback in common that the procedure required for deriving it becomes too much complicated to be used in practice with increasing the number of correctable errors.

Therefore, almost all the error correction systems using the BCH code that have been used so far are limited to those of one-error correction or two-error correction.

SUMMARY OF THE INVENTION

It is an object, therefore, of the present invention to overcome the disadvantages and limitations of a prior error correction decoding system by providing a new and improved error correction decoding system.

It is also an object of the present invention to provide an error correction decoding system for deriving the error locator polynomial with simple circuitry and reduced quantity of calculation even when the number of correctable errors is relatively large.

According to the present invention, a Q determinant or a Q polynominal that gives the value of a coefficient of an error locator polynomial is calculated one by one, using those already claculated, and the A determinants or Q polynomials thus obtained determine the number of error bits, and all the coefficients of the error locator polynomial.

BRIEF DESCRIPTION OF THE DRAWINGS

The foregoing and other objects, features, and attendant advantages of the present invention will be appreciated as the same become better understood by means of the following description and accompanying drawings wherein;

FIG. 3 shows a set of Q determinants that must be calculated to obtain three sets of Q determinants denoted by $<t|0>^c$, $<t|1>^c$, and $<t-1|0>^c$, FIG. 4 shows a set of Q polynomials that must be calculated to obtain a Q polynominal denoted by $(t|0)$, FIG. 8 is a construction diagram of the circuit for calculating an error locator polynomial in FIG. 7, FIG. 9A shows a first portion of an example of controls performed by the Q determinant register control circuit and the syndrome register control circuit of FIG. 8, FIG. 9B shows a second portion of the example of FIG. 9A.

DESCRIPTION OF THE PREFERRED EMBODIMENTS

Figure 1:
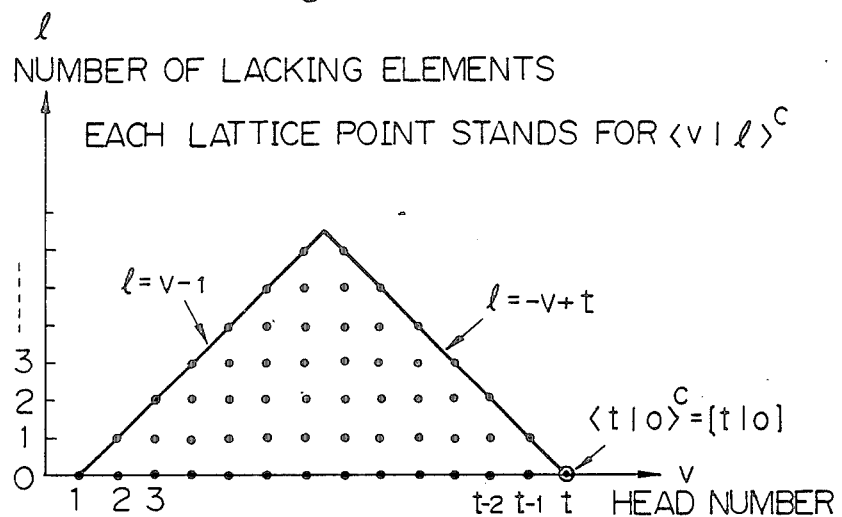
FIG. 1 shows a set of Q determinants that must be calculated to obtain a Q determinant denoted by $[t|0]$.

In the first place, a brief explanation of the t-error correcitng BCH code is given. In the t-error correcting BCH code, any of its code word, denoted by C, comprises k information bits $(a_1, a_2, ---, a_k)$ and q check bits $(a_{k+1}, a_{k+2}, --- a_{k+q})$ that are calculated from the information bits. That is, a codeword C is represented as $$C=(a_1, a_2, ---, a_k, a_{k+1}, ---, a_{k+q}) \tag{1}$$

where $a_i (i=1, 2, ---, k+q)$ is either 0 or 1. And k, q are determined by the following equation.

$$k=2^m-mt-1 \tag{2}$$

$$q=mt \tag{3}$$

where m is an integer and is chosen so that k may be positive. The code length, $k+q=2^m-1$, will be denoted by n in the following.

The check bits of a code word C are determined by the following equation.

$$CH^T = 0 \tag{4}$$

where $H^T$ is the transposed matrix of the check matrix H.

The check matrix H is given as follows.

$$H = \begin{bmatrix} \alpha^{n-1} & \alpha^{n-2} & \ldots & \alpha^2 & \alpha & 1 \\ \alpha^{2(n-1)} & \alpha^{2(n-2)} & \ldots & \alpha^4 & \alpha^2 & 1 \\ \alpha^{3(n-1)} & \alpha^{3(n-2)} & \ldots & \alpha^6 & \alpha^3 & 1 \\ \vdots & & & & & \\ \alpha^{2t(n-1)} & \alpha^{2t(n-2)} & \ldots & \alpha^{2t.2} & \alpha^{2t.1} & 1 \end{bmatrix} \tag{5}$$

where $\alpha$ is a primitive element of the Galois field GF $(2^m)$. Each element of the check matrix H is an element of GF $(2^m)$ and can be represented by a column vector with m elements.

Suppose a codeword $C=(a_1, a_2, \text{---}, a_n)$ changes to another vector $Y=(y_1, y_2, \text{---}, y_n)$ because of an error vector $E=(e_1, e_2, \text{---}, e_n)$. If an error took place at the ith position of C, then $e_i$ is given by 1, and if no error took place at the kth position of C, then $e_k$ is given by 0. That is, $y_i$ of Y is represented by the modulo-2 sum of $a_i$ of C and $e_i$ of E.

The decoding process is defined as restoring the initial code word C from a received word Y by means of the evaluation of error vector E. The invention provides a simple, efficient decoding system for the purpose.

As preliminary knowledge of the explanation to follow, let's explain the concept of a Q determinant and a Q polynomial briefly.

A determinant, denoted by $Q_t$, whose elements are chosen from among the syndromes, is defined as follows.

$$Q_t = \begin{vmatrix} S_2 & S_3 & S_4 & \ldots & S_{t+1} \\ S_3 & S_4 & S_5 & & \\ S_4 & S_5 & S_6 & & \\ \vdots & & & \ddots & \\ S_{t+1} & & \ldots & & S_{2t} \end{vmatrix} \tag{6}$$

A determinant generated from $Q_t$ by removing all the pairs of a row and a column of $Q_t$ sharing one of specified diagonal elements of $Q_t$ is called a Q determinant. $Q_t$ is also a Q determinant. A Q determinant can be represented by simply noting the arrangement of its diagonal elements. For example, in the case of $Q_t$, since it has all of $S_2, S_4, \text{---}, S_{2t}$ as diagonal elements it is represented by $[1, 2, \text{---}, t]$, where $S_{2i}$ is denoted by i. A Q determinant generated from $Q_t$ by removing a row and a column sharing a diagonal element $S_{2i}$ and a row and a column sharing a diagonal element $S_{2j}$ is, likewise, represented by $[1, 2, \text{---}, i-1, i+1, \text{---}, j-1, j+1, \text{---}, t]$. In the representation of a Q determinant $[b_1, b_2, \text{---}, b_p]$, it is assumed that $b_1 < b_2 < \text{---} < b_p$. As explained above, $[b_1, b_2, \text{---}, b_p]$ is the representation derived by noting the existing diagonal elements of Q determinant, (and will be called the first representation of a Q determinant). Inversely, it is also possible to represent a Q determinant by noting the lacking diagonal elements of the Q determinant. With this notation, a Q determinant can be represented as $[v|c_1, c_2, \text{---}, c_l]$. (This will be called the second representation of a Q determinant). $[v|c_1, c_2, \text{---}, c_l]$ represents a determinant derived from $Q_v$ by removing all the pairs of a row and a column, each of which shares one of diagonal elements $c_1, c_2, \text{---}, c_l$. In the above expression, v is called a head number and $c_1, c_2, \text{---}, c_l$ are called lacking elements. If there is no lacking element, it is represented by $[v|0]$. A representation where the head number is included in the set of lacking elements is also permitted. That is, if v is included in $c_1, c_2, \text{---}, c_l$.

$$v = Max(c_1, c_2, \text{---}, c_l) \tag{7}$$

If $v, v-1, v-2, \text{---}, v-i$ are included in $c_1, c_2, \text{---}, c_l$ then, $$[v|c_1, c_2, \text{---}, c_l] = [v-i-1|d_1, d_2, \text{---}, d_{l-i-1}] \tag{8}$$

where $d_1, d_2, \text{---}, d_{l-i-1}$ are obtained by removing $v, v-1, v-2, \text{---}, v-i$ from $c_1, c_2, \text{---}, c_l$.

Therefore, in general, the second representation of a Q determinant is not determined uniquely. But, the second representation of a Q determinant where the head number v is not included in the its lacking elements is uniquely determined. This is called a canonical representation. If it is necessary to emphasize that a second representation is canonical, c is put on the right shoulder of the expression, that is, $$[v|c_1, c_2, \text{---}, c_l]^c$$

In a canonical representation, its head number and lacking elements are called a canonical head number, canonical lacking elements respectively.

Suppose that $c_1, c_2, \text{---}, c_l$ are l natural numbers that are different from one another and not exceeding v. The set of Q determinants represented by $[v|c_1, c_2, \text{---}, c_l]$ is denoted by $<v|1>$. In the same way, if $c_1, c_2, \text{---}, c_l$ are l natural numbers that are different from one another and not exceeding $v-1$, then the set of Q determinants represented by $[v|c_1, c_2, \text{---}, c_l]$ is denoted by $<v|1>^c$. Apparently, $<v|1>$ includes $<v-i|1-i>$ $(i=0, 1, 2, \text{---}, 1)$. And $<v|1>$ is the union of sets represented by $<v-i|1-i>^c (i=0, 1, 2, \text{---}, 1)$.

Since a Q determinant is a symmetrical determinant, any element of which is a syndrome belonging to GF $(2^m)$, and since a diagonal element of it denoted by $S_{2i}$ can be expressed as $S_{2i}=S_i^2$, it is always given as the square of a polynomial of syndromes. The root of a Q determinant, i.e., a polynomial of syndromes, is called a Q polynomial. As in the case of Q determinant representation, two kinds of representation are used for a Q polynomial. That is, the first representation of a Q polynomial is given by $(b_1, b_2, \text{---}, b_p)$ and the second representation is given by $(v|c_1, c_2, \text{---}, c_l)$. Naturally, the following relationships hold.

$$(b_1, b_2, \text{---}, b_p)^2 = [b_1, b_2, \text{---}, b_p] \tag{9}$$

$$(v|c_1, c_2, \text{---}, c_l)^2 = [v|c_1, c_2, \text{---}, c_l] \tag{10}$$

The terms such as "head number", "lacking element", "canonical representation" are equally used in the representation of Q polynomial. Moreover, in the quite same way as in the case of Q determinant, the set of Q polynomials represented by $(v|c_1, c_2, ---, c_l)$ where $c_1, c_2, ---, c_l$ are $l$ natural numbers that are different from one another and not exceeding $v$, is denoted by $<<v|l>>$. Likewise, the set of Q polynomials represented by $(v|c_1, c_2, ---, c_l)$ where $c_1, c_2, ---, c_l$ are $l$ natural numbers that are different from one another and not exceeding $v-1$, is denoted by $<<v|l>>^c$. $<<v|l>>$ includes $<<v-1|l-i>>$ $(i=0, 1, 2, ---, l)$. The set $<<vl|>>$ is the union of sets represented by $<<v-i|l-i>>^c$ $(i=0, 1, 2, ---, l)$.

The following equation concerning Q determinants holds.

(Koga, Yamasaki: "A simple method of calculating the coefficients of error location polynomial in binary BCH code.", paper no. 1456, 1984 National Convention of the Institute of Electronics and Communication Engineers of Japan, March 1984).

$$[b_1, b_2, ---, b_p] = S_{b_p}^2[b_1, b_2, b_3, ---, b_{p-1}] + \qquad (11)$$

$$\sum_{i=1}^{p-1} S_{b_i+b_p}^2[b_1, b_2, ---, b_{i-1}, b_{i+1}, ---, b_{p-1}]$$

where p is greater than or equal to 3. If p is 2, the following equation holds.

$$[b_1, b_2] = S_{b_2}^2[b_1] + S_{b_1}^2 + b_2 \qquad (12)$$

In terms of Q polynomials, the following equation are obtained in place of (11) and (12).

$$(b_1, b_2, ---, b_p) = S_{b_p}(b_1, b_2, ---, b_{p-1}) + \qquad (13)$$

$$\sum_{i=1}^{p-1} S_{b_i+b_p}(b_1, b_2, ---, b_{i-1}, b_{i+1}, ---, b_{p-1})$$

$$(b_1, b_2) = S_{b_2}(b_1) + S_{b_1+b_2} \qquad (14)$$

The relationship between Q determinants, Q polynomials and the error locator polynomial is explained below.

The error locator polynomial of a received word Y is defined as a polynomial whose roots are the error location numbers of the errors in Y. Each error location number indicates a position of Y where a bit error took place. If the number of error bits in Y, denoted by u, does not exceed t, and suppose bit errors took place at the $i_1$th, $i_2$th, ---, $i_u$th positions of Y, error position numbers are defined as $$x_k = \alpha^{n-i_k} \ (k=1, 2, ---, u) \qquad (15)$$

Suppose a polynomial of u-degree having u error location numbers of (15) as its roots is given as the following equation.

$$E_u(x) = \sum_{i=0}^{u} {}_u\theta_i X^i \qquad (16)$$

Squaring the equation (16), we get, $$(E_u(x))^2 = \sum_{i=0}^{u} {}_u\theta_i^2 X^{2i} \qquad (17)$$

Coefficients appearing in the right-hand side of (17), i.e., ${}_u\theta_i^2$'s are given by determinants as described in the paper below. (Koga: "A new decoding method of binary BCH code.", Trans. of the Institute of Electronics and Communication Engineers of Japan. Vol. J66-A, No. 10, pp. 925/932, October 1983).

Namely, $${}_u\theta_i^2 = [u|i] \qquad (18)$$

In terms of Q polynomials, equation (18) becomes as follows.

$${}_u\theta_i = (u|i) \ (i=0, 1, 2, ---, u) \qquad (19)$$

Therefore, if u, the number of error bits is determined, the coefficients of $E_u(x)$ or $(E_u(x))^2$ are obtained according to (18) or (19). Apparently, since $E_u(x)$ and $(E_u(x))^2$ have the same roots, either of them can be used as an error location polynomial in question. The number of error bits u can be estimated as described below.

(Koga: "A new decoding method of binary BCH code.", Trans. of the Institute of Electronics and Communication Engineers of Japan, Vol. J66-A, No. 10, pp. 925/932, October 1983).

That is, if $v=u$ or $v=u-1$ then $[v|0]\neq 0$ and if $v>u$ then $[v|0]=0$.

In terms of Q polynomials, the above rule becomes as follows.

if $v=u$ or $v=u-1$ then $(v|0)\neq 0$ and if $v>u$ then $(v|0)=0$.

Therefore, the number of error bits u is obtained by the following process. Calculation of $[v|0]$ or $(v|0)$ is continued for a series of v's values that are decreasing and starting with t one by one, i.e., $v=t, t=t-1, v=t-2, ---$. Then, at $v=u$ $[v|0]$ or $(v|0)$ becomes non-zero for the first time in the calculation process.

Since the error locator polynomial $E_v(x)$ or $(E_v(x))^2$ can be used not only in $v=u$ but in $v=u+1$, it is not necessary to determine the value of u uniquely.

The paper shows that it is also possible to estimate that either $u=v_0$ or $u=v_0+1$ where $v_0$ is obtained by the following process. That is, calculating $[v|0]$ or $(v|0)$ for a series of v's values starting with $v=t-1$ and decreasing with a common difference of 2, and finding $v=v_0$ at which $[v|0]$ or $(v|0)$ becomes non-zero for the first time in the calculation process. (Koga: "A new decoding method of binary BCH code.", Trans. of the Institute of Electronics and Communication Engineers of Japan. Vol. J66-A, No. 10, pp. 925/932. October 1983.)

Since the number of error bits u of a received word is estimated by calculating Q determinants or Q polynomials and the corresponding error locator polynomial is also obtained by calculating Q determinants or Q polynomials, it is highly desireable to calculate Q determinants or Q polynomials efficiently with simple circuitry. The decoding system of this invention is characterized by efficient calculation of required Q determinants or Q polynomials with simple circuitry and with reduced quantity of calculation.

Let's explain the calculation method for Q determinants and Q polynomials of the invention. In the first place, consider the calculation of Q determinants.

Figure 2:
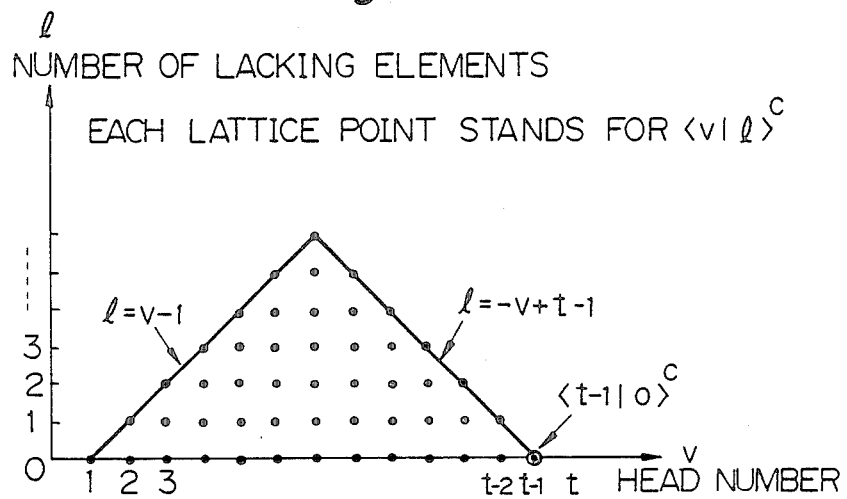
FIG. 2 shows a set of Q determinants that must be calculated to obtain a Q determinant denoted by $[t-1|0]$.

As stated earlier, in order to estimate u, the number of error bits, at first $[t|0]$ or $[t-1|0]$ should be calculated. FIG. 1 shows all the Q determinants that should be calculated in the course of obtaining $[t|0]$. Likewise, FIG. 2 shows all the Q determinants that should be calculated in the course of obtaining $[t-1|0]$. In FIG. 1 and FIG. 2, a point whose coordinates of the horizontal axis and that of the vertical axis are given by v, l respectively represents the set of Q determinants $<v|l>^c$. To obtain $[t/0]$ it is necessary to calculate $<v|l>^c$'s that are in the area enclosed with three lines, i.e., the horizontal axis, $l=v-1$, and $l=-v+t$ one by one in the ascending order to v (To calculate $<v|l>^c$ means to calculate Q determinants in $<v|l>^c$. Likewise, to obtain $[t-1|0]$ it is necessary to calculate $<v|l>^c$'s that are in the area enclosed with three lines, i.e., the horizontal axis, $l=v-1$ and $l=-v+t-1$ one by one in the ascending order of v. The order of calculations of $<v|l>^c$'s having the same value of v is arbitrary. Furthermore the order of calculations of Q determinants in the same $<v|l>^c$ is also arbitrary. If the Q determinants are calculated in the order described above, the calculation of Q determinant can necessarily be carried out in one of the following three manners (a), (b), and (c).

(a) When $<v|l>^c$ which contains the Q determinant to be calculated is on $l=v-1$, $<v|l>^c$ is equal to $<v|v-1>^c$ and any Q determinant that belongs to it is a determinant composed of only one element. Therefore, the value of the Q determinant is obtained as the element itself which is a syndrome.

(b) When $<v|l>^c$ which contains the Q determinant to be calculated is on $l=v-2$, $<v|l>^c$ is equal to $<v|v-2>^c$ and any Q determinant that belongs to it is determinant of degree 2. Therefore, according to equation (12), the Q determinant can be calculated by using the syndrome and the Q determinant which was already calculated.

(c) When $<v|l>$ which contains the Q determinant to be calculated is on neither $l=v-1$ nor $l=v-2$, any Q determinant that belongs to it is expanded according to equation (11) as follows.

$$[v|c_1, c_2, -, c_l]^c = \sum_{\substack{j=0 \\ j \neq c_i}}^{v-1} S_{v+j}^2 [v-1|c_1, c_2, -, c_l, j] \quad (20)$$
$$(i = 1, 2, -, l)$$

Therefore, the Q determinant is obtained as the sum of $v-1$ products, each of which is a product of the square of a syndrome and a Q determinant whose head number is $v-1$ and the number of lacking elements is $l$ or $l+1$. It should be noted that any Q determinant whose head number, number of lacking elements are $v-1$, $l$, respectively, is contained in $<v-1|l>$ and any Q determinant whose head number, number of lacking elements are $v-1$, $l+1$, respectively is contained in $<v-1|l+1>$. Since $<v-1|l>$ is the union of $<v-1-i|l-i>^c$ ($i=0, 1, ---, l$) and $<v-1|l+1>$ is the union of $<v-1-i|l+1-i>^c$ ($i=0, 1, ---, l+1$), both were calculated before the Q determinant in $<v|l>^c$ is calculated. Therefore, any Q determinant belonging to $<v|l>^c$ is obtained as the sum of products, each of which is a product of the square of a syndrome and a Q determinant that was already calculated.

In FIG. 1, when the calculation of $<v|l>^c$'s in an area enclosed with the three lines is performed one by one in the ascending order of v up to $<t|0>^c$ not only $[t|0]$ but also all the $[i|0]$'s ($i=1, 2, ---, t-1$) are obtained in the course of calculation. Therefore, the number of error bits can be estimated using them. In the same way, in FIG. 2, when the calculation of $<v|l>^c$'s is performed one by one in the ascending order of v up to $<t-1|0>^c$ not only $[t-1|0]$ but also all the $[t-1-2i|0]$ ($i=1, 2, ---, \lfloor t-1/2 \rfloor$) where $\lfloor x \rfloor$ stands for a maximum integer not exceeding x, are obtained. Therefore, the number of error bits can be estimated using them as either u or $u-1$.

When the number of error bits is estimated as u, or it is estimated as either u or $u-1$, $(E_u(x))^2$ is generated as an error locator polynomial.

As equation (18) indicates, the coefficients $u\theta_i^2$'s ($i=0, 1, 2, ---, u$) of $(E_u(x))^2$ are given by Q determinants represented by $[u|i]$'s, which are contained in $<u|0>^c$, $<u|1>^c$, and $<u-1|0>^c$. Accordingly, if u is equal to t, $<t|0>>^c$ $<t|1>^c$, and $<t-1|0>^c$ have to be calculated. In FIG. 3, the calculation for them is carried out by calculating $<v|l>^c$'s that are in an area enclosed with four lines, i.e., the horizontal axis, $l=v-1$, $l=-v+t+1$, and $v=t$ one by one in the ascending order of v. As FIG. 3 shows, in the course of obtaining $<t|0>0>^c$, $<t|1>^c$, all the Q determinants that are required to determine the coefficients of $(E_u(x))^2$ for any u, the number of error bits, less than t are calculated as well.

Moreover, the set of $<v|l>^c$'s in FIG. 3 includes those in FIG. 1 and FIG. 2. Therefore, when all the $<v|l>^c$'s in FIG. 3 are calculated, the number of error bits u can be estimated and all the coefficients of $(E_u(x))^2$ are determined for any value of u not exceeding t. At a decoder of this system, if a supposed maximum amount of calculation for obtaining an error locator polynomial, i.e., equivalent to that for the case of $u=t$, is allowed for any received word regardless of the number of errors in it, all the $<v|l>^c$'s shown in FIG. 3 should be calculated for any received word. This makes the decoding process constant and easy to control. On the other hand, if the average amount of calculation required for obtaining an error locator polynomial is to be reduced $>v|l>^c$'s shown in FIG. 2 should be calculated first to estimate the number of error bits u. If all the Q determinants that give the coefficients of $(E_u(x))^2$ of the estimated u have not been calculated in the above calculation, only ones that have not been obtained should be calculated. That is, $<v|l>^c$'s that are shown in FIG. 3 and not shown in FIG. 2 are calculated one by one in the ascending order of v, according to equation (20) using already calculated Q determinants until the coefficients of $(E_u(x))^2$ get determined.

What is described above is an efficient method of calculating Q determinants for use in estimating the number of error bits and deriving the error locator polynomial. Then, in the following, an efficient method of calculating Q polynomials for the same purpose is described.

Figure 5:
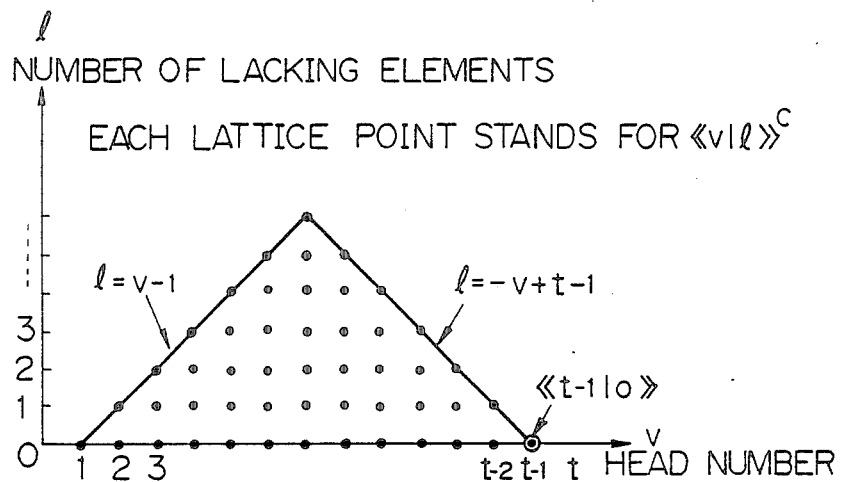
FIG. 5 shows a set of Q polynomials that must be calculated to obtain a Q polynomial denoted by $(t-1|0)$.

The estimation of the number of errors necessarily requires the calculation of either $(t|0)$ or $(t-1|0)$. FIG. 4 shows all the Q polynomials that should be calculated in the course of obtaining $(t|0)$, and FIG. 5 shows all the Q polynomials that should be calculated in the course of obtaining $(t-1|0)$. In FIG. 4 and FIG. 5, a point whose coordinate of the horizontal axis, that of the vertical axis are v, l, respectively stands for the set of Q polynomials denoted as $(v|c_1, c_2, ---, c_l)^c$, that is $<<v|l>>$.

In order to obtain (t|0), the calculation of $<<v|1>>^c$'s that are in an area enclosed with three lines, i.e., the horizontal axis, $l=v-1$, and $l=-v+t$, is performed one by one in the ascending order of v. In the same way, for obtaining (t−1|0), the calculation of $<<v|1>>^c$'s that are in an area enclosed with three lines i.e., the horizontal axis, $l=v-1$, and $l=-v-t-1$, is performed one by one in the ascending order of v. The order of calculation of $<<v|1>>^c$'s having the same value of v is arbitrary. The order of calculation of Q polynomials in the same $<<v|1>>^c$ is also arbitrary. If the Q polynomials are calculated in the order described above, the calculation of Q polynomials can necessarily be carried out in one of the following three manners (d), (e), and (f).

(d) When $<<v|1>>^c$ which contains the Q polynomial to be calculated is on $l=v-1$, $<<v|1>>^c$ is equal to $<<v|v-1>>^c$, any Q polynomial belonging to it is easily obtained as the square root of a Q determinant composed of only one element.

(e) When $<<v|1>>^c$ which contains the Q polynomial to be calculated is on $l=v-2$, $<<v|1>>^c$ is equal to $<<v|v-2>>^c$, and any Q polynomial belonging to it is calculated as the sum of a syndrome and a product of a Q polynomial already calculated and a syndrome according to equation (14).

(f) When $<<v|1>>^c$ which contains the Q polynomial to be calculated is on neither $l=v-1$ nor $l=v-2$, any Q polynomial that belongs to it is expanded according to equation (13) as follows.

$$(v|c_1, c_2, \ldots, c_l)^c = \sum_{\substack{j=0 \\ j \neq c_i}}^{v-1} S_{v+j}(v-1|c_1, c_2, \ldots, c_l, j) \quad (21)$$
$$(i = 1, 2, \ldots, l)$$

Therefore, the Q polynomial is obtained as the sum of $v-1$ products, each of which is a product of a syndrome and a Q polynomial whose head number is $v-1$ and the number of lacking elements is l or $l+1$. Any Q polynomial whose head number, number of lacking elements are $v-1$, l, respectively is contained in $<<v-1|1>>$, and any Q polynomial whose head number, number of lacking elements are $v-1$, $l+1$, respectively is contained in $<<v-1|l+1>>$. As $<<v-1|1>>$ is the union of $<<v-1-i|l-i>>^c$'s (i=0, 1, ---, l) and $<<v-1|l+1>>$ is the union of $<<v-1-i|l+1-i>>^c$'s (i=0, 1, ---, l+1), both were calculated before the Q polynomial in $<<v|1>>^c$ is calculated. Therefore, any Q polynomial contained in $<<v|1>>^c$ can be calculated as the sum of products, each of which is a product of a Q polynomial already calculated and a syndrome.

In FIG. 4, when the calculation of $<<v|1>>^c$'s in an area enclosed with three lines is performed one by one in the ascending order of v up to $<<t|0>>^c$, not only (t|0) but also all the (i|0)'s (i=1, 2, ---, t−1) are obtained in the course of calculation. Therefore, the number of errors u can be estimated using them. Likewise, in FIG. 5, when the calculation of $<<v|1>>^c$'s is performed one by one in the ascending order of v up to $<<t-1|0>>^c$, not only (t−1|0) but all the (t−1−2i|0)'s (i=1, 2, ---, $\lfloor(t-1)/2\rfloor$) are obtained in the course of calculation. Therefore, the number of error bits can be estimated as u or u−1.

Figure 6:
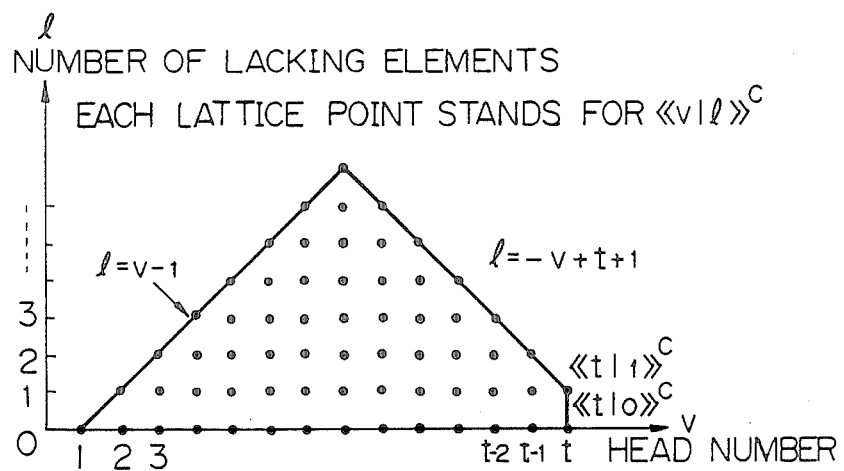
FIG. 6 shows a set of Q polynomials that must be calculated to obtain three sets of Q polynomials denoted by $<<t|0>>^c$, $<<t|1>>^c$, and $<<t-1|0>>^c$.

In this way, when the number of error bits is estimated u or when it is estimated either u or u−1, the corresponding error position polynomial $E_u(x)$ is generated. As equation (19) indicates, each coefficient of $E_u(x)$, i.e., $u\theta i$ (i=0, 1, ---, u) is given by a Q polynomial (u|i) that is contained in $<<u|0>>^c$, $<<u|1>>^c$, and $<<u-1|0>>^c$. Therefore, if u is equal to t, $<<t|0>>^c$, $<<t|1>>^c$, and $<<t-1|0>>^c$ should be calculated. The calculation required for them is carried out, as shown in FIG. 6, by calculating $<<v|1>>^c$'s in an area enclosed with four lines, i.e., the horizontal axis, $l<v-1$, $l=-v+t+1$, and $v=t$ one by one in the ascending order of v. Also, as is seen in FIG. 6, in the course of calculating $<<t|0>>^c$, and $<<t|1>>^c$, all the Q polynomials that give the coefficients of $E_u(x)$ for any u, the number of error bits, not exceeding t are obtained. Moreover, the set of $<<v|1>>^c$'s in FIG. 6 includes those of $<<v|1>>^c$'s in FIG. 4 and FIG. 5. Therefore, the calculation of all the $<<v|1>>^c$'s in FIG. 6 is sufficient to estimate the number of error bits u as well as to give the coefficients of $E_u(x)$ for any u not exceeding t.

If a supposed maximum amount of calculation for obtaining an error position polynomial, i.e., equivalent to that for the case of u=t is allowed for any received word regardless of the errors in it, all the $<<v|1>>^c$'s shown in FIG. 6 should be calculated for any received word to make the calculation control simple. On the other hand, if the average amount of calculation required for obtaining an error locator polynomial is to be reduced $<<v|1>>^c$'s shown in FIG. 5 should be calculated first to estimate the number of error bits u. If all the Q polynomials required for determining the coefficients of $E_u(x)$ have not been calculated in the above calculation, $<<v|1>>^c$'s that are shown in FIG. 6 and not shown in FIG. 5 should be calculated according to equation (21) in the ascending order of v using already calculated Q polynomials.

The order of calculating Q determinants explained above is shown in the following example of t=6. All the $<v|1>^c$'s shown in FIG. 3 are calculated.

| | |
|---|---|
| $<1\|0>^c$ | $[1] = S_1^2$ |
| $<2\|0>^c$ | $[1,2] = S_2^2[1] + S_3^2$ |
| $<2\|1>^c$ | $[2] = S_2^2$ |
| $<3\|0>^c$ | $[1,2,3] = S_3^2[1,2] + S_4^2[2] + S_5^2[1]$ |
| $<3\|1>^c$ | $[2,3] = S_3^2[2] + S_5^2$ |
| | $[1,3] = S_3^2[1] + S_4^2$ |
| $<3\|2>^c$ | $[3] = S_3^2$ |
| $<4\|0>^c$ | $[1,2,3,4] = S_4^2[1,2,3] + S_5^2[2,3] + S_6^2[1,3] + S_7^2[1,2]$ |
| $<4\|1>^c$ | $[2,3,4] = S_4^2[2,3] + S_6^2[3] + S_7^2[2]$ |
| | $[1,3,4] = S_4^2[1,3] + S_5^2[3] + S_7^2[1]$ |
| | $[1,2,4] = S_4^4[1,2] + S_5^2[2] + S_6^2[1]$ |
| $<4\|2>^c$ | $[1,4] = S_4^2[1] + S_5^2$ |
| | $[2,4] = S_4^2[2] + S_6^2$ |
| | $[3,4] = S_4^2[3] + S_7^2$ |
| $<4\|3>^c$ | $[4] = S_4^2$ |
| $<4\|0>^c$ | $[1,2,3,4,5] = S_5^2[1,2,3,4] + S_6^2[2,3,4] + S_7^2[1,3,4] + S_8^2[1,2,4] + S_9^2[1,2,3]$ |
| $<5\|1>^c$ | $[2,3,4,5] = S_5^2[2,3,4] + S_7^2[3,4] + S_8^2[2,4] + S_9^2[2,3]$ |
| | $[1,3,4,5] = S_5^2[1,3,4] + S_6^2[3,4] + S_9^2[1,4] + S_9^2[1,3]$ |
| | $[1,2,4,5] = S_5^2[1,2,4] + S_6^2[2,4] + S_7^{2[1,4]} + S_9^2[1,2]$ |
| | $[1,2,3,5] = S_5^2[1,2,3] + S_6^2[2,3] + S_7^2[1,3] + S_8^2[1,2]$ |
| $<5\|2>^c$ | $[1,2,5] = S_5^2[1,2] + S_6^2[2] + S_7^2[1]$ |
| | $[1,3,5] = S_5^2[1,3] + S_6^2[3] + S_8^2[1]$ |
| | $[1,4,5] = S_5^2[1,4] + S_6^2[4] + S_9^2[1]$ |
| | $[2,3,5] = S_5^2[2,3] + S_7^2[3] + S_8^2[2]$ |
| | $[2,4,5] = S_5^2[2,4] + S_7^2[4] + S_9^2[2,4]$ |
| | $[3,4,5] = S_5^2[3,4] + S_8^2[4] + S_9^2[3]$ |
| $<6\|0>^c$ | $[1,2,3,4,5,6] = S_6^2[1,2,3,4,5] + S_7^2[2,3,4,5] + S_8^2[1,3,4,5] + S_9^2[1,2,4,5] + S_{10}^2[1,2,3,5] + S_{11}^2[1,2,3,4]$ |
| $<6\|1>^c$ | $[2,3,4,5,6] = S_6^2[2,3,4,5] + S_8^2[3,4,5] + S_9^2[2,4,5] + S_{10}^2[2,3,5] + S_{11}^2[2,3,4]$ |
| | $[1,3,4,5,6] = S_6^2[1,3,4,5] + S_7^2[3,4,5] + S_9^2[1,4,5] +$ |

-continued $$S_{10}^2[1,3,5] + S_{11}^2[1,3,4]$$
$$[1,2,4,5,6] = S_6^2[1,2,4,5] + S_7^2[2,4,5] + S_8^2[1,4,5] + S_{10}^2[1,2,5] + S_{11}^2[1,2,4]$$
$$[1,2,3,5,6] = S_6^2[1,2,3,5] + S_7^2[2,3,5] + S_8^2[1,3,5] + S_9^2[1,2,5] + S_{11}^2[1,2,3]$$
$$[1,2,3,4,6] = S_6^2[1,2,3,4] + S_7^2[2,3,4] + S_8^2[1,3,4] + S_9^2[1,2,4] + S_{10}^2[1,2,3]$$

As seen in the above example, a new Q determinant is easily calculated using Q determinants already calculated and syndromes. In the above example, if all the Q determinants are replaced with the corresponding Q polynomials and any square of a syndrome is replaced with the syndrome itself, the above example of Q determinant calculation becomes that of Q polynomial calculation.

(Embodiment)

Figure 7:
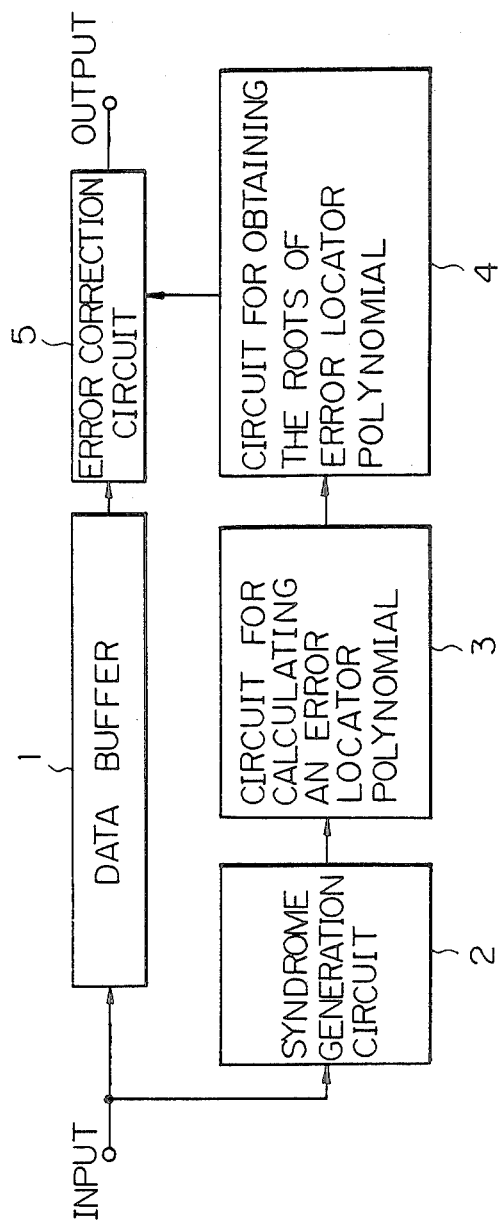
FIG. 7 is a construction diagram of the embodiment of an decoding system according to the present invention.
Figure 10:
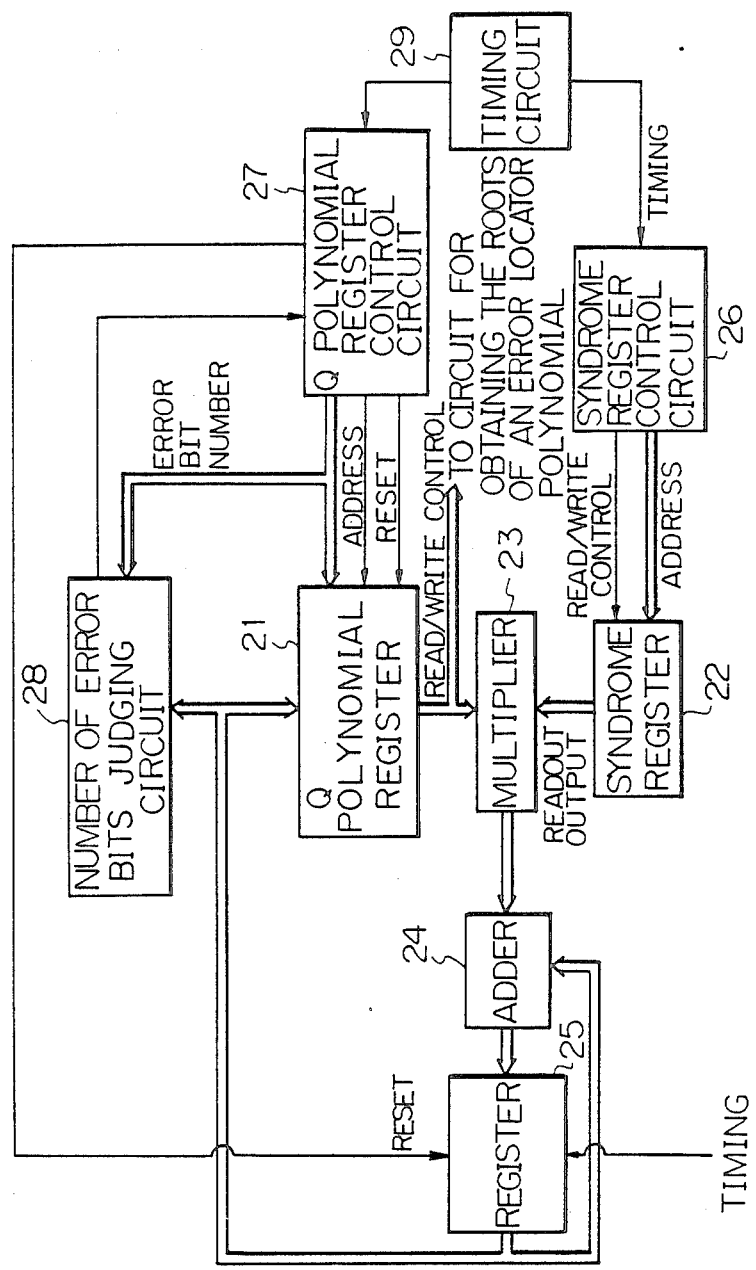
FIG. 10 is a construction diagram of the circuit for calculating an error locator polynomial in FIG. 7, where Q polynomials are used.

Let's explain the embodiment of a decoder of this invention with drawings. FIG. 7 is a construction diagram of the embodiment of a decoding system of this invention. In FIG. 7, 1 stands for a data buffer for temporally storing received words, 2 stands for a syndrome generation circuit for generating the syndromes of received words, 3 stands for a circuit for calculating an error locator polynomial from the syndromes obtained in 2, 4 stands for a circuit for obtaining the roots of an error locator polynomial that calculates the roots of an error locator polynomial provided by 3. 5 stands for an error correction circuit that inverts error bits of a received word indicated by the roots of an error locator polynomial obtained by 4. FIG. 8 and FIG. 10 show construction diagrams of circuit for calculating an error locator polynomial 3 of FIG. 7. The construction diagrams of FIG. 8 and FIG. 10 are those of using Q determinants and of using Q polynomials respectively. What follows is an explanation of this decoding system.

When a received word Y is input at the decoding system, it gets stored in data buffer 1 and at the same time it is supplied to syndrome generation circuit 2, where the syndromes of Y, i.e., $S_1, S_2, ---, S_{2t}$ are calculated. The calculation of syndromes can be performed by putting Y into feedback shift register circuits as described, e.g., in "The Theory of Error-Correcting Codes, Part 1" (by F. J. Mac Williams, and N. J. A. Sloane, North-Holland Publishing Company pp. 270/272.). Syndromes of the form $S_{2i}(i=1, 2, ---, t)$ can also be obtained by squaring $S_i$ that is obtained in the above explained method. As each syndrome is an element of $GF(2^m)$ and can be represented by a vector with m elements, a circuit for squaring syndrome is realized with a ROM (Read Only Memory) of m-bit words whose address size is m bits.

Then, $S_1, S_2, ---, S_{2t}$, syndrome thus generated are supplied to circuit for calculating an error locator polynomial 3. At this circuit, an error locator polynomial is generated from the syndromes. The circuit for calculating an error locator polynomial will be explained in detail later with reference to FIG. 8 and FIG. 10. The roots of an error locator polynomial provided by the above circuit is calculated in circuit for obtaining the roots of an error locator polynomial 4. Usually, as described in "The Theory of Error-Correction Codes, Part 1" (by F. J. Mac Williams and N. J. A. Sloane, North-Holland Publishing Company, pp. 275/277), so-called Chien Search is conducted where error location numbers are generated one by one, and are substituted into the error locator polynomial to examine if it becomes zero or not. In this way by finding out the roots of the error locator polynomial at this circuit, the position of error bits included in the received word get clarified. When the received word stored in data buffer 1 is shifted out to error correcting circuit 5, the error bits are corrected by inversion. This kind of error correction circuit is usually realized with exclusive-or logic circuits.

Then, let's explain the circuit for calculating error locator polynomial mentioned earlier, that is one of the characteristic features of this invention. The circuit for calculating error locator polynomial in a decoding system of this invention calculates Q determinants or Q polynomials from the syndrome of a received word efficiently with simple circuitry, to determine the coefficients of the error locator polynomial. In the first place, a circuit of using Q determinants is explained with FIG. 8, where all the $<v|1>^c$'s that are shown in FIG. 3 are calculated one by one in the ascending order of v. In FIG. 8, 11 stands for a Q determinant register for storing a calculated Q determinant, 12 stands for a syndrome register for storing the syndromes, i.e., $S_1, S_2, ---, S_{2t}$ generated in syndrome generation circuit 2, 13 stands for a squaring circuit for squaring a syndrome, 14 stands for a multiplier for calculating a product of a Q determinant stored in Q determinant register 11 and the square of a syndrome produced at squaring circuit 13, 15 stands for an adder for adding the output of multiplier 14 and that of register 16, 17 stands for s syndrome register control circuit for controlling the input and the output of a syndrome to and from syndrome register 12, 18 stands for a Q determinant register control circuit for controlling the input and the output of a Q determinant to and from Q determinant register 11, 19 stands for number of error bits judging circuit for judging the number of error bits by using the Q determinants, and 20 stands for a timing circuit.

How this circuit for calculating an error locator polynomial works is described below for the case of t=6 as an example.

To begin with, Q determinant register 11 and register 16 get reset, and syndromes $S_1, S_2, ---, S_{2t}$ that are generated in syndrome generation circuit 2 are transferred to syndorme register 12. In an address position of Q determinant register 11 that is not used by any Q determinant, 1 is stored which is first read out and is put into multiplier 14. At the same time, $S_1$ is read out from syndrome register 12, and it becomes $S_1^2$ in passing through squaring circuit 13, then this is put into multiplier 14. The result of multiplication, $S_1^2$ is stored into register 16 and then it is transferred to Q determinant register 11 as [1]. Register 16 is reset after $S_1^2$ is stored in Q determinant register 11. Then, [1] is read out from Q determinant register 11 and is input into multiplier 14. At the same time, $S_2$ is read out from syndrome register 12 which becomes $S_2^2$ in passing through squaring circuit 13 and $S_2^2$ is input into multiplier 14. To the output of multiplier 14, i.e., $S_2^2[1]$, 0, the contents of register 16 is added at adder 15, and the output of adder 15, $S_2^2[1]$, is stored into register 16. Then, 1 is read out from Q determinant register 11 and is input into multiplier 14, at the same time, $S_3$ is read out from syndrome register 12 which becomes $S_3^2$ in passing through squaring circuit 13 and $S_3^2$ is input into multiplier 14. To the output of multiplier 14, i.e., $S_3^2$ and the contents of register 16, $S_2^2[1]$ is added at adder 15, and the output of adder 15, $S_2^2[1] + S_3^2$ is stored into register 16 and is transferred to Q determinant register 11 as [1, 2]. Then, register 16 is reset as before. In this way, with repetition of a simple process, Q determinants are calculated one by one. In the course of calculation, whenever [i|0]=[1, 2, - - -, i] (i=1, 2, - - -, t) is calculated, the number of error bits judging circuit 19 examines its value. If [i|0]≠0 the number of error bits judging circuit 19 holds the value of i and at the same time the previous one that has been held in it is erased. Therefore, the value of i the number of error bits judging circuit 19 holds when calculation of all the Q determinants is over, is the number of error bits u. When the number or error bits u is determined in this way, each coefficient $u\theta i^2 = [u|i]$ of the corresponding error locator polynomial $(E_u(x))^2$ is read out from Q determinant register 11 and is sent to circuit for obtaining the roots of error locator polynomial 4. The performance described above is controlled by Q determinant register control circuit 18 and syndrome register control circuit 17. For storing each syndrome into syndrome register 12, syndrome register control circuit 17 provides a write command and an address of storage location to syndrome register 12. When storage of all the syndromes in syndrome register 12 is completed then calculation of Q determinants follows. As explained earlier, calculation of Q determinants is carried out by calculating all the $<v|1>^c$'s shown in FIG. 3 one by one in the ascending order of v. An example of the order of calculating Q determinants was already shown for the case of t=6. In calculating each Q determinant, Q determinant register control circuit 18 controls the reading out of the appropriate Q determinants from Q determinant register 11 and the writing of the calculated Q determinant into the appropriate address of Q determinant register 11 by means of designating an appropriate address of Q determinant register, while, syndrome register control circuit 17 controls the read-out of appropriate syndrome from the syndrome register 12. For example, a Q determinant denoted by [1, 3, 4, 5] is calculated as follows.

$$[1, 3, 4, 5] = S_5^2[1, 3, 4] + S_6^2[3, 4] + S_8^2[1, 4] + S_9^2[1, 3]$$

FIG. 9 shows the controlling functions performed by Q determinant register control circuit 18 and syndrome register control circuit 17 in calculating the above equation. As seen in FIG. 9, a lot of controls with appropriate designated addresses for read-out and write-in are required. The contorl information can be stored in a ROM beforehand, and it can be read out according to time.

When calculation of Q determinants is completed, and so a judged number of error bits u is obtained, this number of error bits u is input to Q determinant register contorl circuit 18, which performs the control of reading out each [u|i], being equal to u ⊕ i (i=0, 1, 2, - - - , u), from Q determinant register 11. The address of each [u|i] where the value of u is given, can be stored in a ROM beforehand so that the control becomes simpler.

A circuit shown in FIG. 10 is the one for calculating an error locator polynomial using Q polynomials. In FIG. 10, 21 stands for a Q polynomial register for storing calculated Q polynomials, 22 stands for a syndrome register for storing syndromes $S_1, S_2, - - -, S_{2t}$ that are generated in syndrome generation circuit 2, 23 stands for a multiplier for obtaining a product of an already calculated Q polynomial stored in Q polynomial register 21 and a syndrome, 24 stands for an adder for calculating the sum of the output of multiplier 23 and the output of register 25, 26 stands for s syndrome register control circuit for controlling the input and output of a syndrome to and from the syndrome register 22, 27 stands for a Q polynomial register control circuit for controlling the input and output of a Q polynomial to and from Q polynomial register 21, 28 stands for a number of error bits judging circuit, and 29 stands for a timing circuit.

The performance of this circuit for calculating an error locator polynomial shown in FIG. 10 can be understood easily with reference to the circuit in FIG. 8 because it is only necessary to replace the Q determinants with Q polynomials and to omit the squaring circuit 13.

This invention provides an error correction equipment with simple circuitry that can decode any received code word with reduced quantity of calculation.

From the foregoing it will now be apparent that a new and improved error correction code decoding system has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. An error correcting code decoding method wherein a received code word $Y = (Y_1, Y_2, - - -, Y_n)$ is corrected, said method comprising the steps of:

calculating the syndrome vector $(S_1, S_2, - - -, S_{2t}) = YH^t$ where H is the parity check matrix;

calculating $Q_t$, a symmetry determinant of order t whose elements are chosen systematically from amont syndromes, and determinants derived from $Q_t$ by means of first specifying some diagonal elements of $Q_t$ and then removing all the pairs of a row and a column of $Q_t$ sharing one of the specified diagonal elements from $Q_t$ (these derived determinants, together with $Q_t$, are generally termed "Q determinants");

determining the coefficients of an error locator polynomial from said Q determinants; and locating the error bit positions of said received code word Y by calculating the roots of the error locator polynomial and correcting them;

wherein said Q determinants are obtained by holding the values of Q determinants already calculated in a storage facility, and calculating, in a calculating facility, the product of a Q determinant stored in said storage facility with the square of syndrome one by one for a predetermined Q determinant-syndrome combination set, adding them up, and storing the result in said storage facility as a new Q determinant.

2. An error correction code decoding method wherein a received code word $Y = (Y_1, Y_2, - - -, Y_n)$ is corrected, said method comprising the steps of:

calculating the syndrome vector $(S_1, S_2, - - -, S_{2t}) = YH^t$ where H is the parity check matrix;

calculating the square roots of $Q_t$, a symmetry determinant of order t whose elements are chosen systematically from among the syndromes, and determinants derived from $Q_t$ by means of first specifying some diagonal elements of $Q_t$ and then removing all the pairs of a row and a column of $Q_t$ sharing one of the specified diagonal elements from $Q_t$ (these derived determinants, together with $Q_t$, are generally termed "Q determinants",) (the square root of each Q determinant, a polynomial of syndromes is called a "Q polynomial");

determining the coefficients of an error locator polynomial from said Q polynomials; and designating the error bit positions of said received code word Y by calculating the roots of the error position polynomial and correcting them;

wherein said Q polynomials are obtained by holding the values of Q polynomials already calculated in storage facility, and calculating, in a facility for calculating, the produce of a Q polynomial stored in said storage facility with a syndrome one by one for a predetermined Q polynomial-syndrome combination set, adding them up, and storing the result into said storage facility as a new Q polynomial.

3. An error correction code decoding system, comprising:

a data buffer (1) for storing an input data;

a syndrome generation circuit (2) for providing a syndrome of an input signal;

a calculating circuit (3) coupled with output of said syndrome generation circuit (2) for calculating an error locator polynomial by using said syndrome;

an obtaining circuit coupled with the output of said syndrome generation circuit (4) for obtaining the roots of the error locator polynomial; and an error correction circuit (5), operatively coupled to said data buffer and siad obtaining circuit, and which corrects errors of an input signal by inverting the error bits at the output of said data buffer (1) according to the solutions of the error locator polynomial obtained by said obtaining circuit (4), and wherein said calculating circuit (3) includes, a syndrome register (12) for storing syndrome generated by said syndrome generation circuit (2), a squaring circuit (13) for providing the square of the syndrome which is the output of said syndrome register (12), a Q determinant register (11) which stores multiple calculated Q determinants, a multiplier (14) operatively connected to said squaring circuit and said Q determinant register for providing the produce of the outputs of said Q determinant register (11) and said squaring circuit (13), a second register (16), operatively coupled with said Q determinant register and said multiplier, wherein Q determinants are obtained as the result of accumulation of the outputs of said multiplier (14), and an output of said second second register (16) being applied to said Q determinant register (11), an adder disposed between said register and said nultiplier (15) for providing the sum outputs of said multiplier (14) and said second register (16) which stores the output of said adder (15), the sum of the adder (15) being applied to said second register (16), a number-of-error-bits-judging-circuit (19) which accepts specified Q determinants output from said second register (16), and determines the number of error bits (u) where u is the maximum number of v satisfying $[v|0] \neq 0$, whereby i'th coeffcients $(_u\theta_i)$ of error locator polynomial is provided by $[u|i]$, which are obtained as the output of said second register (16) and stored in said Q determinant register (11).

4. An error correction code decoding system according to claim 3, wherein said obtaining circuit (4) for solving error locator polynomial obtains solution through Chien search in which each error location number is tested if it satisfies said error locator polynomial, and when it satisfies the polynomial corresponding bit position is determined to be an error.

5. An error correction code decoding system, comprising:

a data buffer (1) for storing an input data;

a syndrome generation circuit (2) for providing a syndrome of the input signal;

a calculating circuit (3) coupled with output of said syndrome generation circuit (2) for calculating an error locator polynomial by using said syndrome;

an obtaining circuit, coupled with the output of said syndrome generating circuit, (4) for obtaining the roots of the error locator polynomial; and an error correction circuit (5), operatively coupled with said data buffer and said obtaining circuit, and which corrects errors of the input signal by inverting the error bits at the output of said data buffer (1) according to the solutions of the error locator polynomial obtained by said obtaining circuit (4), and wherein said calculating circuit (3) includes, a syndrome register (22) for storing syndrome generated by said syndrome generation circuit (2), a Q polynomial register (21) which stores multiple calculated Q polynomials, a multiplier disposed between said syndrome register and said Q polynomial register, (23) for providing the product of the outputs of said Q polynomial register (21) and said syndrome register (22), a second register, operatively connected to said Q polynomial register and said multiplier (25) in which Q polynomials are obtained as the result of accumulation of the outputs of said multiplier (23), and an output of said second register (25) being applied to said Q polynomial register (21), an adder, disposed between said multiplier and said second register, (24) for providing the sum of outputs of said multiplier (23) and said second register (25) which stores the output of said adder (24), the sum of the adder (24) being applied to said second register (25), a number-of-error-bits-judging-circuit (28) which accepts specified Q polynomials output from said second register 925), and determines the number of error bits (u) where u is the maximum number of v satisfying $[v|0] \neq 0$, whereby i'th coefficients of error locator polynomial is provided by $(u|i)$ which is obtained as the output of said second register (25) and stored in said Q polynomial register (21).

* * * * *

UNITED STATES PATENT AND TRADEMARK OFFICE
CERTIFICATE OF CORRECTION

PATENT NO. : 4,694,455
DATED : September 15, 1987
INVENTOR(S) : KEIICHIRO KOGA ET AL It is certified that error appears in the above-identified patent and that said Letters Patent is hereby corrected as shown below:

On the cover page, after Item [19], change "KOGA" to --- KOGA ET AL ---.

On the cover page, Item [75], after "Saitama," insert --- NORIKAZU YAMAZAKI, Tokyo, TAKURO MURATANI, Kanagawa, all of ---.

Signed and Sealed this

Twenty-ninth Day of March, 1988

Attest:

DONALD J. QUIGG

Attesting Officer

Commissioner of Patents and Trademarks